US010074669B2

(12) United States Patent
Lius (10) Patent No.: US 10,074,669 B2
(45) Date of Patent: Sep. 11, 2018

(54) DISPLAY DEVICE

(71) Applicant: InnoLux Corporation, Miao-Li County (TW)

(72) Inventor: Chandra Lius, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/480,423

(22) Filed: Apr. 6, 2017

(65) Prior Publication Data

US 2018/0158842 A1    Jun. 7, 2018

Related U.S. Application Data

(60) Provisional application No. 62/429,162, filed on Dec. 2, 2016.

(51) Int. Cl.
| | |
|---|---|
| *H01L 27/12* | (2006.01) |
| *H01L 29/24* | (2006.01) |
| *H01L 29/786* | (2006.01) |
| *H01L 29/423* | (2006.01) |

(52) U.S. Cl.
CPC ........ *H01L 27/1225* (2013.01); *H01L 27/124* (2013.01); *H01L 27/1222* (2013.01); *H01L 27/1251* (2013.01); *H01L 29/24* (2013.01); *H01L 29/42356* (2013.01); *H01L 29/7869* (2013.01); *H01L 29/78648* (2013.01); *H01L 29/78675* (2013.01); *H01L 29/78696* (2013.01)

(58) Field of Classification Search
CPC ............. H01L 27/1225; H01L 27/1222; H01L 27/124; H01L 27/1251; H01L 29/24; H01L 29/42356; H01L 29/78648; H01L 29/78675; H01L 29/7869; H01L 29/78696
USPC .......................................................... 257/43
See application file for complete search history.

(56) References Cited

U.S. PATENT DOCUMENTS

| | | | | |
|---|---|---|---|---|
| 2007/0046191 | A1* | 3/2007 | Saito | .................. H01L 27/1248 313/506 |
| 2017/0125452 | A1* | 5/2017 | Ide | ...................... H01L 27/1251 |

* cited by examiner

*Primary Examiner* — Cuong Q Nguyen
*Assistant Examiner* — Tong-Ho Kim
(74) *Attorney, Agent, or Firm* — Bacon & Thomas, PLLC (57) ABSTRACT

A display device is disclosed, which includes: a substrate having a display region and a peripheral region adjacent to the display region; a first transistor disposed on the display region and comprising a first channel layer, wherein the first channel layer includes an oxide semiconductor layer; and a second transistor disposed on the peripheral region and comprising a second channel layer, wherein the second channel layer includes a silicon semiconductor layer. Herein, a first ratio, which is a ratio of a first channel width of the first channel layer to the first channel length thereof, is greater than or equal to 0.4 and less than or equal to 4.5; and a second ratio, which is a ratio of a second channel width of the second channel layer to a second channel length thereof, is greater than or equal to 0.05 and less than or equal to 0.8.

18 Claims, 6 Drawing Sheets

DISPLAY DEVICE

CROSS REFERENCE TO RELATED APPLICATION

This application claims the benefit of filing date of U.S. Provisional Application Ser. No. 62/429,162 filed Dec. 2, 2016 under 35 USC § 119(e)(1).

BACKGROUND

1. Field

The present disclosure relates to display devices, and more particularly to a display device comprising both a low-temperature polycrystalline silicon (LTPS) thin film transistor and a metal oxide thin film transistor.

2. Description of Related Art

With the continuous advancement of technologies related to displays, all the display panels are now developed toward compactness, thinness, and lightness. This trend makes thin displays, such as liquid crystal display panels, organic light-emitting diode display panels and inorganic light-emitting diode display panels, replace cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

While liquid crystal display devices and organic light-emitting diode display devices are popular on the market, in which LCD display devices particularly enjoy technical maturity; manufacturers pay even more effort to improve display devices in terms of display quality thereby answering to ongoing technical development of display devices and consumers' increasing demands.

The thin film transistor (TFT) structure can be polycrystalline silicon thin film transistors (TFT) featuring high carrier mobility, or metal oxide thin film transistors (TFT) featuring low leakage. Though some of the features of polycrystalline silicon TFT and the features of metal oxide TFT are complementary to each other, there are presently no display combining these two types of transistors because the processes for making the two are not quite compatible, making the overall manufacturing of display devices complicated (such as by requiring more times of chemical vapor deposition process).

In view of this, a need exists for an improved and simplified process for manufacturing a thin film transistor (TFT) substrate that has both a polycrystalline silicon thin film transistor (TFT) and a metal oxide thin film transistor (TFT).

SUMMARY

The object of the present disclosure is to provide a display device, which has both a LTPS thin film transistor and a metal oxide thin film transistor at the same time.

The display device of the present disclosure comprises: a first substrate having a display region and a peripheral region being adjacent to the display region; a first transistor disposed on the display region and comprising a first channel layer, wherein the first channel layer comprises an oxide semiconductor layer; and a second transistor disposed on the peripheral region and comprising a second channel layer, wherein the second channel layer comprises a silicon semiconductor layer; wherein a first ratio is a ratio of a first channel width of the first channel layer to the first channel length of the first channel layer, and a second ratio is a ratio of a second channel width of the second channel layer to a second channel length of the second channel layer; wherein the first ratio is greater than or equal to 0.4 and less than or equal to 4.5, and the second ratio is greater than or equal to 0.05 and less than or equal to 0.8.

In the display device of the present disclosure, the first transistor comprising the oxide semiconductor layer is disposed on the display region. When the first ratio of the first channel width to the first channel length of the first channel layer is designed and within the above range, good resolution, better aperture ratio, good brightness uniformity and/or high frame rate can be achieved. In addition, in the display device of the present disclosure, the second transistor comprising the silicon semiconductor layer is disposed on the peripheral region. When the second ratio of the second channel width to the second channel length of the second channel layer is designed and within the above range, high charging performance can be achieved, and the peripheral region area can further be reduced. In addition, when the first ratio and the second ratio are within the above ranges, the electrical performance of the first transistor can be more compatible to the charging ability of the second transistor.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Embodiment 1

Figure 1:
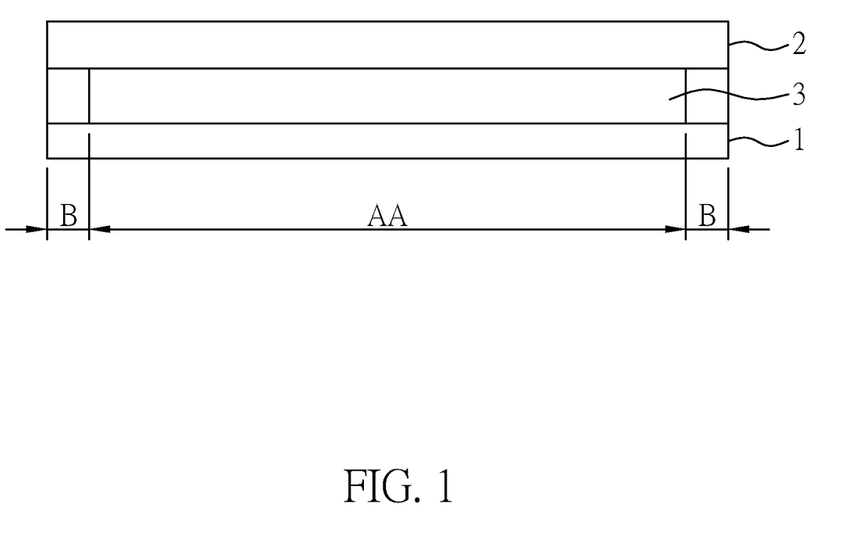
FIG. 1 is a schematic cross sectional view of a display device according to Embodiment 1 of the present disclosure.

FIG. 1 is a schematic cross sectional view of a display device of the present embodiment. Therein, the display device comprises: a first substrate 1; a second substrate 2 opposite to the first substrate 1; and a display medium layer 3 arranged between the first substrate 1 and the second substrate 2. In the present embodiment, the first substrate 1 and the second substrate 2 may be prepared by glass, plastic, a flexible material or a thin film; but the present disclosure is not limited thereto. When the first substrate 1 and the second substrate 2 is prepared by the plastic, the flexible material or the thin film, the display device can be a flexible display device. In the present embodiment, the display medium 3 may comprise a liquid crystal layer or a light emitting diode (for example, an inorganic light emitting diode or an organic light emitting diode); but the present disclosure is not limited thereto. In addition, in other embodiments of the present disclosure, when the display medium 3 is the light emitting diode, the display device can be optionally made without the second substrate 2.

Figure 2:
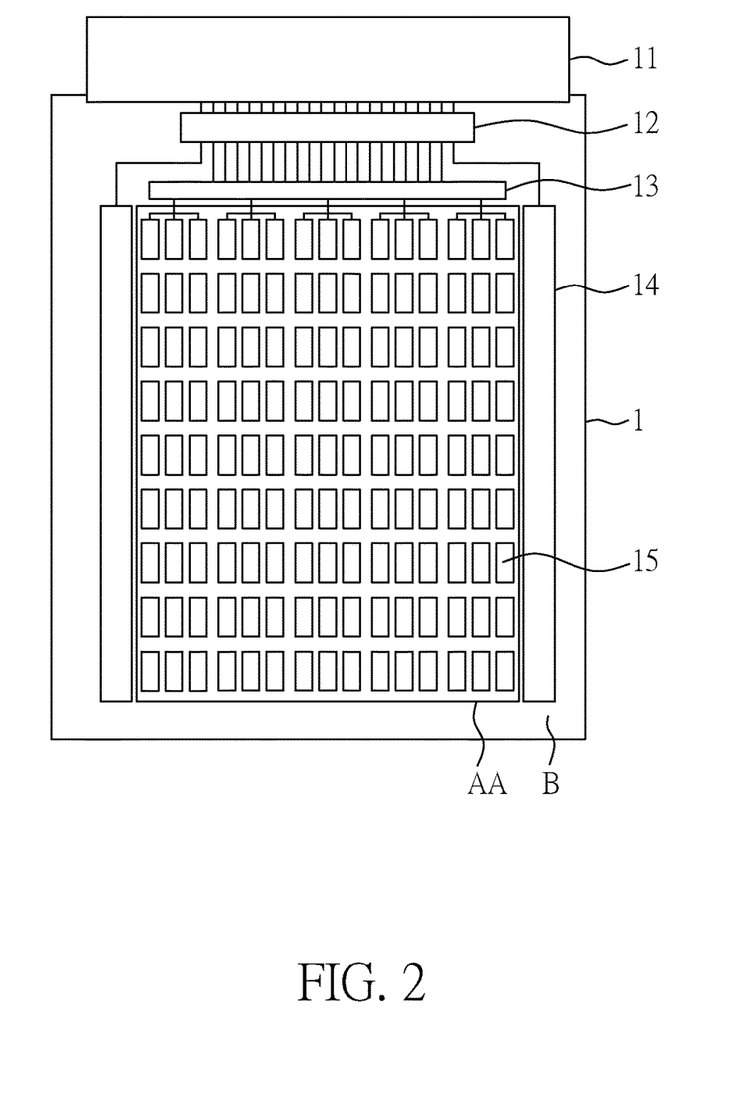
FIG. 2 is a top view of a display device according to embodiment 1 of the present disclosure.

FIG. 2 is a top view of a display device of the present embodiment. As shown in FIG. 1 and FIG. 2, the display device of the present embodiment comprises: a display region AA and a peripheral region B, and the peripheral region B is adjacent to the display region AA. As shown in FIG. 2, the display device of the present embodiment comprises: a print circuit board 11 partially disposed on the peripheral region B; an IC 12 disposed on the peripheral region B and electrically connecting to the print circuit board 11; a demultiplexer 13 disposed on the peripheral region B and electrically connecting to the IC 12; a driver circuit 14 disposed on the peripheral region B and electrically connecting to the IC 12; and plural pixel units 15 disposed on the display region AA, wherein the pixel units 15 receive signals from the driver circuit 14 and the demultiplexer 13.

Figure 3:
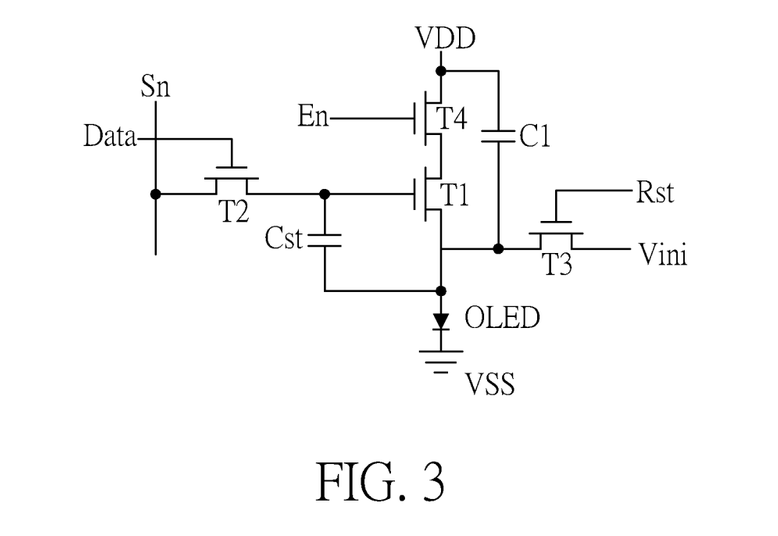
FIG. 3 is an equivalent-circuit diagram of a pixel of the display device with a light emitting diode according to Embodiment 1 of the present disclosure.

In the display device of the present embodiment, the first substrate 1 is provided with plural pixel units 15. When the display medium 3 is a light emitting diode (for example, an inorganic light emitting diode or an organic light emitting diode), one of these pixel units may be designed as, for example, the equivalent-circuit diagram as shown in FIG. 3. In the equivalent-circuit diagram of FIG. 3, the pixel unit comprises: a driving thin film transistor T1; a switching thin film transistor T2, wherein a scan signal Sn and a data signal Data are transferred to the switching thin film transistor T2; a reset thin film transistor T3, wherein an initialization voltage Vini and a reset signal Rst are transferred to the reset thin film transistor T3 for initializing the driving thin film transistor T1; an emitting thin film transistor T4, wherein an emission control signal En is transferred to the emitting thin film transistor T4; a first capacitor C1; and a second capacitor Cst. Hence, the equivalent-circuit diagram shown in FIG. 3 is a 4T2C circuit. In addition, a driving voltage VSS is transferred to an organic light emitting diode OLED; and a cathode of the organic light emitting diode OLED is connected to a common voltage VSS. Herein, the organic light emitting diode display device is exemplified. However, the present disclosure is not limited to, and the above equivalent-circuit diagram can also be applied to an inorganic light emitting diode display device such as micro LED display device.

Figure 4:
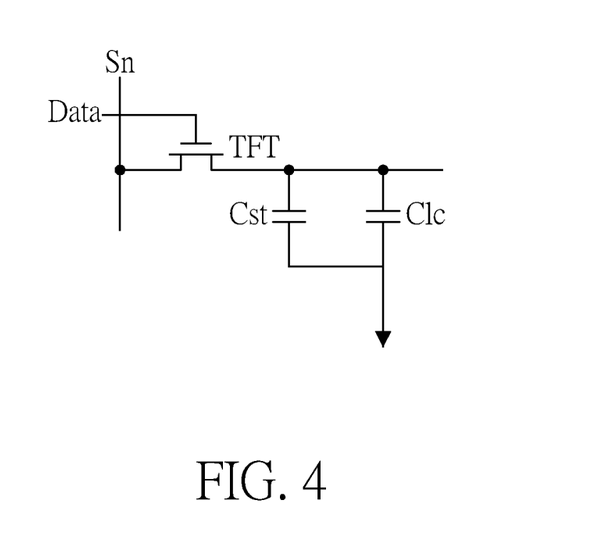
FIG. 4 is an equivalent-circuit diagram of a pixel of the LCD display device according to Embodiment 1 of the present disclosure.

When the display medium 3 is a liquid crystal layer, one of these pixel units may be designed as, for example, the equivalent-circuit diagram as shown in FIG. 4. In the equivalent-circuit diagram of FIG. 4, the pixel unit comprises: a thin film transistor TFT, wherein a scan signal Sn and a data signal Data are transferred to the thin film transistor TFT; a capacitor Cst; and a liquid crystal capacitance Clc resulted from the liquid crystal layer.

In the display device with the equivalent-circuit diagram of FIG. 3, at least one of the transistors is a transistor comprising an oxide semiconductor layer (for example, IGZO thin film transistor, ITZO thin film transistor, or IGTZO thin film transistor). In the display device with the equivalent-circuit diagram of FIG. 4, the thin film transistor TFT is a transistor comprising an oxide semiconductor layer. Hereinafter, an IGZO thin film transistor is used as an example in the present embodiment. Compared to the LTPS thin film transistor, the IGZO thin film transistor has higher process uniformity, resulting in better threshold voltage uniformity and lower current leakage; therefore, the IGZO thin film transistor is more suitable for the transistors in the display region.

Furthermore, in both the display devices with the equivalent-circuit diagrams of FIGS. 3 and 4, the driver circuit 14 and the demultiplexer 13 may also comprise plural transistors. The transistors used in the driver circuit 14 and the demultiplexer 13 can be a transistor comprising a silicon semiconductor layer (for example, low-temperature polycrystalline silicon (LTPS) thin film transistor) for the narrow border design. In addition, the LTPS thin film transistor can be used in a smaller specific area and show good TFT performance uniformity. Compared to the IGZO thin film transistor, the LTPS thin film transistor has higher charging ability and is much suitable for narrow border design.

Figure 5:
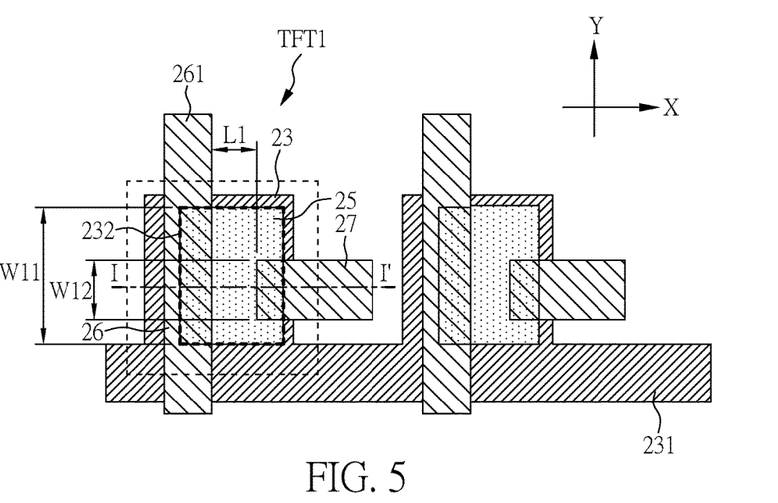
FIG. 5 is a top view of first transistors on the first substrate according to Embodiment 1 of the present disclosure.
Figure 6:
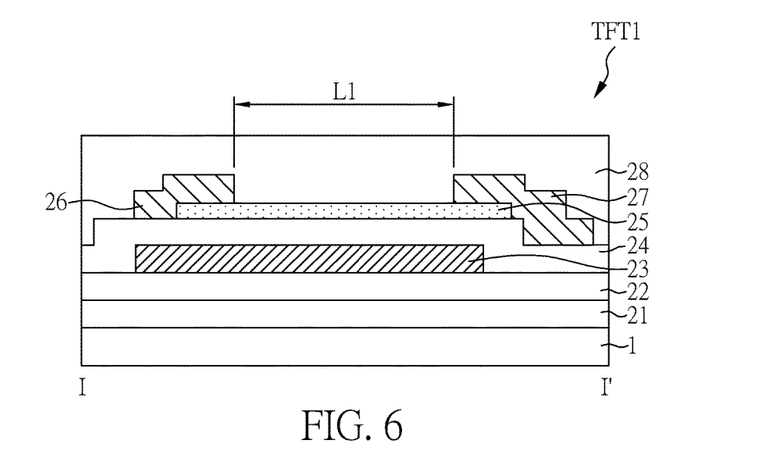
FIG. 6 is a schematic cross sectional view of one of the first transistor shown in FIG. 5 along a line I-I'.

FIG. 5 is a top view of first transistors on the first substrate of the present embodiment, which is an IGZO thin film transistor (TFT); and FIG. 6 is a schematic cross sectional view of one of the first transistor shown in FIG. 5 along a line I-I'. The manufacturing process of the IGZO TFT is briefly described blow.

First, a first substrate 1 is provided, followed by forming a first buffer layer 21 and a second buffer layer 22 on the first substrate 1. Next, a first gate electrode 23 is formed on the second buffer layer 22, followed by forming a first gate insulating layer 24 on the first gate electrode 23. Then, a first channel layer 25 being an oxide semiconductor layer is formed on the first gate insulating layer 24, followed by forming a first source electrode 26 and a first drain electrode 27 on the first channel layer 25. Finally, a passivation layer 28 is formed on the first source electrode 26 and the first drain electrode 27, and the IGZO TFT of the present embodiment is obtained.

Figure 7:
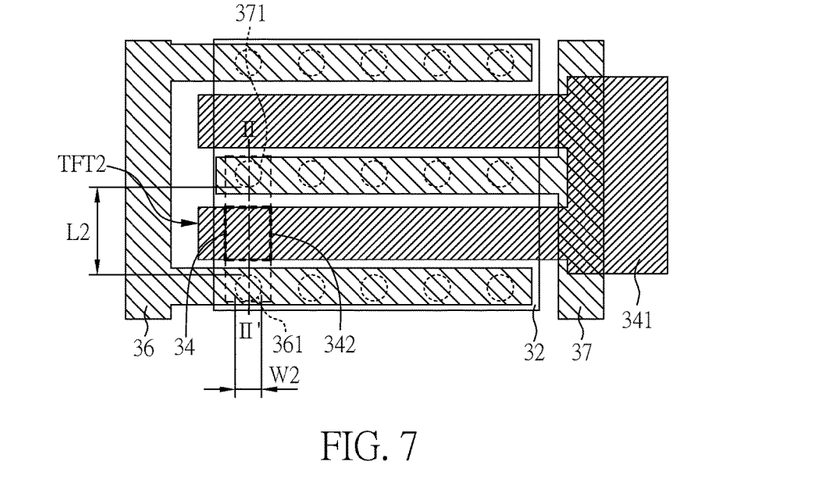
FIG. 7 is a top view of second transistors on the first substrate according to Embodiment 1 of the present disclosure.
Figure 8:
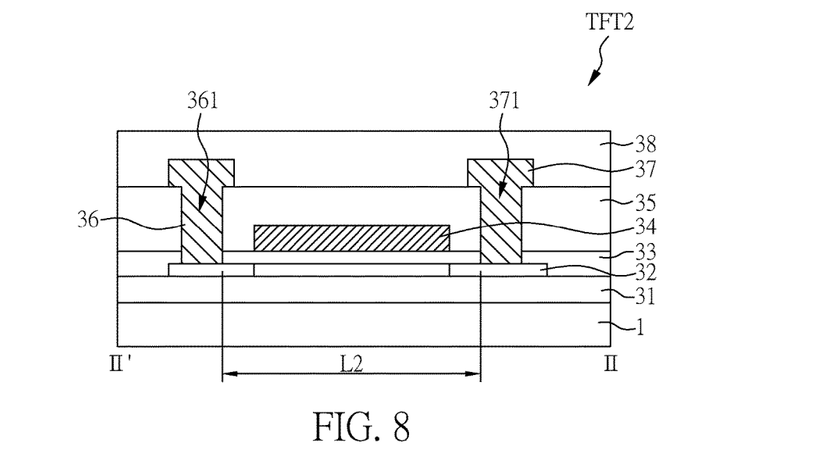
FIG. 8 is a schematic cross sectional view of one of the second transistor shown in FIG. 7 along a line II-II'.

FIG. 7 is a top view of second transistors on the first substrate of the present embodiment, which is a LTPS thin film transistor (TFT); and FIG. 8 is a schematic cross sectional view of one of the second transistor shown in FIG. 7 along a line II-II'. The manufacturing process of the LTPS TFT is briefly described below.

First, a first substrate 1 is provided, followed by forming a third buffer layer 31 on the first substrate 1. Next, an amorphous silicon layer is formed on the buffer layer 31, and then an annealing process is applied onto the amorphous silicon layer to obtain a second channel layer 32. The second channel layer 32 is a silicon semiconductor layer which is a low temperature polysilicon layer. Herein, regions of the second channel layer 32 that a second source electrode 36 and a second drain electrode 37 to be formed thereon are doped. After forming the second channel layer 32, a second gate insulating layer 33 is formed. Then, a second gate electrode 34 is formed on the second gate insulating layer 33, followed by forming an interlayer dielectric layer 35. A second source electrode 36 and a second drain electrode 37 are formed on the interlayer dielectric layer 35 and electrically connect to the second channel layer 32 through contact vias 361, 371. Finally, a passivation layer 38 is formed on the second source electrode 36 and the second drain electrode 37, and the LTPS TFT of the present embodiment is obtained.

Herein, the material for the first substrate 1 is illustrated above and not repeated again. The first buffer layer 21, the second buffer layer 22, the first gate insulating layer 24, the passivation layer 28, the third buffer layer 31, the second gate insulating layer 33, the interlayer dielectric layer 35 and the passivation layer 38 can be prepared by any insulating material such as silicon oxide, silicon nitride, silicon nitroxide or a combination thereof; but the present disclosure is not limited thereto. In addition, the first gate electrode 23, the first source electrode 26, the first drain electrode 27, the second gate electrode 34, the second source electrode 36 and the second drain electrode 37 can be prepared by metals (such as Cu, Al, Ti, Cr, Mo, or alloy thereof) or other electrode materials (such as transparent conductive oxide, for example, ITO, IZO, ITZO and so on); but the present disclosure is not limited thereto.

In the present embodiment, the IGZO TFT shown in FIG. 5 and FIG. 6 and the LTPS TFT shown in FIG. 7 and FIG. 8 can be prepared simultaneously, even though the descriptions thereof are separated herein.

In addition, in the present embodiment, when preparing the IGZO TFT shown in FIG. 5 and FIG. 6, a scan line 231 and the first gate electrode 23 are simultaneously formed. When preparing the LTPS TFT shown in FIG. 7 and FIG. 8, a scan line 341 and the second gate electrode 34 are simultaneously formed. Even though the figures do not show, in some embodiment, the scan line 231 can electrically connect to the scan line 341; so the first transistor TFT1 can electrically connect to the second transistor TFT2.

After the aforementioned process, the display device of the present embodiment is obtained. As shown in FIG. 1, FIG. 2, and FIG. 5 to FIG. 8, the display device comprises: a first substrate 1 having a display region AA and a peripheral region B being adjacent to the display region AA; a first transistor TFT1 disposed on the display region AA and comprising a first channel layer 25, wherein the first channel layer 25 comprises an oxide semiconductor layer (which is an IGZO layer in the present embodiment); and a second transistor TFT2 disposed on the peripheral region. B and comprising a second channel layer 32, wherein the second channel layer 32 comprises a silicon semiconductor layer (which is a low temperature polysilicon layer in the present embodiment).

In the display device of the present embodiment, the second transistor TFT2 comprises a silicon semiconductor layer, and the second transistor TFT2 is a LTPS TFT. When the transistors on the peripheral region B are LTPS TFTs, plural LTPS TFTs as gate drivers are serially connected to provide large current, and the purpose of good charging ability and/or reliability performance can be achieved. In addition, for the purpose of narrow peripheral region, the area of the peripheral region B has to be reduced to increase the area of the display region AA. When the transistors on the peripheral region B are LTPS TFTs, the LTPS TFTs should have small channel width and channel length to use the peripheral region B effectively. Hence, it is possible to dispose LTPS TFTs on the peripheral region B with a limited area, and the purpose of narrow peripheral region can be achieved.

On the other hand, in the display device of the present embodiment, the first transistor TFT1 comprises an oxide semiconductor layer, and the first transistor TFT1 is an oxide TFT. When the transistors on the display region AA are oxide TFTs, the purpose of good Vth uniformity, lower current leakage and/or better display quality can be achieved.

As shown in FIG. 5, the display device of the present embodiment further comprises a scan line 231 electrically connecting to the first transistor TFT1, wherein the scan line extends along a first direction X. In addition, the first transistor TFT1 further comprises a first source electrode 26 and a first drain electrode 27. Herein, a first channel length L1 is defined, which is a minimum distance between the first source electrode 26 and the first drain electrode 27 along the first direction X. Furthermore, the first source electrode 26 has a first source width W11 along a second direction Y substantially vertical to the first direction X, and the first drain electrode 27 has a first drain width W12 along the second direction Y. Herein, a first channel width W1 is defined, which is an average width of the first source width. W11 and the first drain width W12, i.e. W1=(W11+W12)/2. Herein, the first direction X is substantially vertical to the second direction Y; which means an angle between the first direction X and the second direction Y can be within 85 degree to 90 degree.

As shown in FIG. 7, the second transistor TFT2 further comprises a second source electrode 36 and a second drain electrode 37, and the second source electrode 36 and the second drain electrode 37 electrically connect to the second channel layer 32 through contact vias 361, 371. Herein, a second channel width W2 is defined, which is a maximum width of the contact vias 361, 371. Furthermore, a second channel length L2 is also defined, which is a minimum distance between the contact via 361 and the contact via 371. Herein, the second channel width. W2 is substantially vertical to the second channel length L2; which means an angle between the second channel width W2 and the second channel length L2 can be within 85 degree to 90 degree.

It is known the drain current is related to the channel width and the channel length of the transistor. The relation therebetween is shown in the following Equation 1.

$$I_{drain} = W/L \times \mu \times Cox \times (Vgs - Vth) \quad \text{[Equation 1]}$$

W: Channel width
L: Channel length

Cox: Capacitor per unit area
Vgs: Gate-to-source voltage
Vth: Threshold voltage

For the first transistor TFT1, as shown in FIG. 5, a first ratio is a ratio of a first channel width W1 of the first channel layer 25 to the first channel. length L1 of the first channel layer 25. In the present embodiment, the first ratio is greater than or equal to 0.4 and less than or equal to 4.5, i.e. $0.4 \leq W1/L1 \leq 4.5$. When the first ratio is within the above range, the display device can be designed to have high resolution, high aperture ratio, good brightness uniformity and/or high frame rate. If the first ratio is less than 0.4 (for example, the first channel length L1 is too long), the charging ability of the first transistor TFT1 is not enough, the charging time thereof is increased, and the frame rate thereof is reduced. In addition, the aperture ratio of the display device is also reduced. If the first ratio is more than 4.5 (for example, the first channel width W1 is too long), the parasitic capacitance between gate electrode and source/drain electrode Cgs is increased, resulting in the feed-through effect increased.

In another embodiment, the first ratio is greater than or equal to 0.75 and less than or equal to 2.5, i.e. $0.75 \leq W1/L1 \leq 2.5$. Display devices having the first transistor TFT1, in which the W1/L1. is designed within this range, would be high resolution and have high charging ability, better display quality and high aperture ratio, which further lower the power usage of the display devices.

If the lower limit of the first ratio is increased to 1, the charging ability of the first transistor TFT1 can further be improved. If the upper limit of the first ratio is reduced to 1.5, the resolution of the display device can further be increased, and/or the parasitic capacitance Cgs and the feed-through effect can further be decreased. Hence, in further another embodiment, the first ratio is greater than or equal to 1 and less than or equal to 1.5, i.e. $1 \leq W1/L1 \leq 1.5$.

For the second transistor TFT2, as shown in FIG. 7, a second ratio is a ratio of a second channel width W2 of the second channel layer 32 to a second channel length L2 of the second channel layer 32. In the present embodiment, the second ratio is greater than or equal to 0.05 and less than or equal to 0.8, i.e. $0.05 \leq W2/L2 \leq 0.8$. When the first ratio is within the above range, the second transistor TFT2 can have high charging ability and low current leakage, and/or the display device can have narrow border area. In addition, when the IGZO TFT (first transistor TFT1) is disposed on the display region and the LTPS TFT (second transistor TFT2) is disposed on the peripheral region, the current leakage of the IGZO TFT (first transistor TFT1) may be increased if the current input into the IGZO TFT from the LTPS TFT is too large. Moreover, the parasitic capacitance Cgs or Cgd become large when the second ratio of the second transistor TFT2 is too big. Herein, if the second ratio is less than 0.05 (for example, the second channel width W2 is too short), the charging ability of the second transistor TFT2 is not enough, and the charging time thereof is increased. More LTPS TFTs have to be connected in series, resulting in the peripheral region area of the display device increased, i.e. bigger bezel or border of the device. If the second ratio is more than 0.8 (for example, the second channel length L2 is too short), severe current leakage may be occurred, and the positive bias temperature stress (PBTS) is poor.

In another embodiment, the second ratio is greater than or equal to 0.09 and less than or equal to 0.45, i.e. $0.09 \leq W2/L2 \leq 0.45$. When the second transistor TFT2 is designed to have W2/L2 within this range, the charging ability of the second transistor TFT2 can be improved, and/or the narrow peripheral region can be maintained. Furthermore, when the upper limit of the second ratio is larger than 0.45, the current leakage of the second transistor TFT2 is too big, resulting in bad charging ability and poor PBTS reliability.

In further another embodiment, the second ratio is greater than or equal to 0.3 and less than or equal to 0.45, i.e. $0.3 \leq W2/L2 \leq 0.45$. The lower limit of the second ratio is further increased to 0.3, to assure the overall charging ability of the second transistor TFT2 in the peripheral region will be much more uniformed and improved. In addition, the number of the connected TFTs in series can be reduced, so the peripheral region area can further be decreased.

As shown in FIGS. 5 and 7, the first transistor TFT1 further comprises a first gate electrode 23 comprising a first overlapping area 232, and the first overlapping area 232 and the first channel layer 25 overlap. The second transistor TFT2 further comprises a second gate electrode 34 comprising a second overlapping area 342, and the second overlapping area 342 and the second channel layer 32 overlap. Herein, the first overlapping area 232 is larger than the second overlapping area 342.

As shown in FIGS. 6 and 8, in the first transistor TFT1, the first gate electrode 23 is disposed below the first channel layer 25, so the first transistor TFT1 is a bottom gate TFT. In the second transistor TFT2, the second gate electrode 34 is disposed above the second channel layer 32, so the second transistor TFT2 is a top gate TFT. If the second transistor TFT2 has the top gate structure, lower current leakage and lower parasitic capacitance from capacitance coupling between the second gate electrode 34 and the second source electrode 36/second drain electrode 37 can be achieved. And, this lowered current leakage will enhance the performance of the LTPS TFTs in gate driver circuitry, resulting in the charging ability thereof improved.

Embodiment 2

Figure 9:
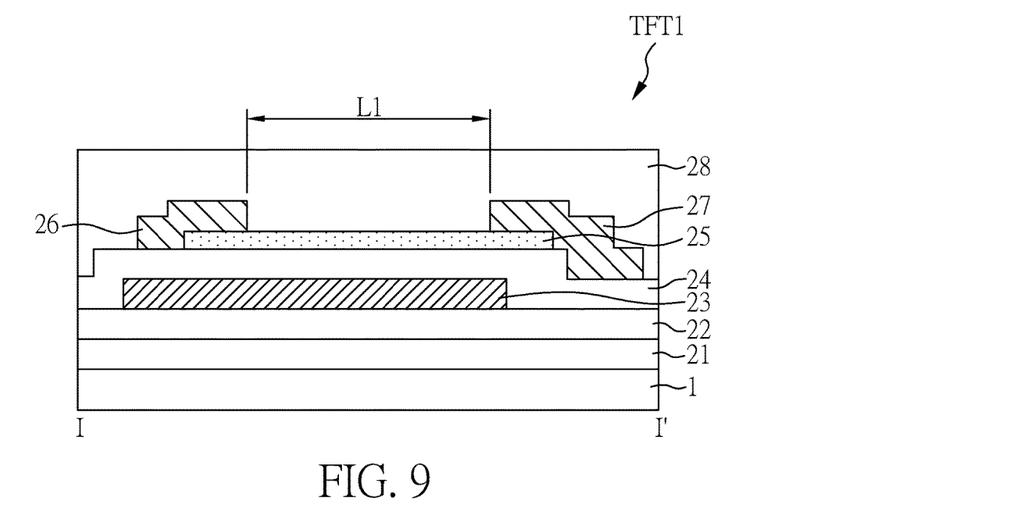
FIG. 9 is a schematic cross sectional view of the first transistor according to Embodiment 2 of the present disclosure.

FIG. 9 is a schematic cross sectional view of the first transistor f the present embodiment.

The display device of the present embodiment is similar to that of Embodiment 1, except that the overlapping region between the first gate electrode 23 and the first drain electrode 27 is reduced in the present embodiment. Therefore, the parasitic capacitance Cgd can further be reduced.

Embodiment 3

Figure 10:
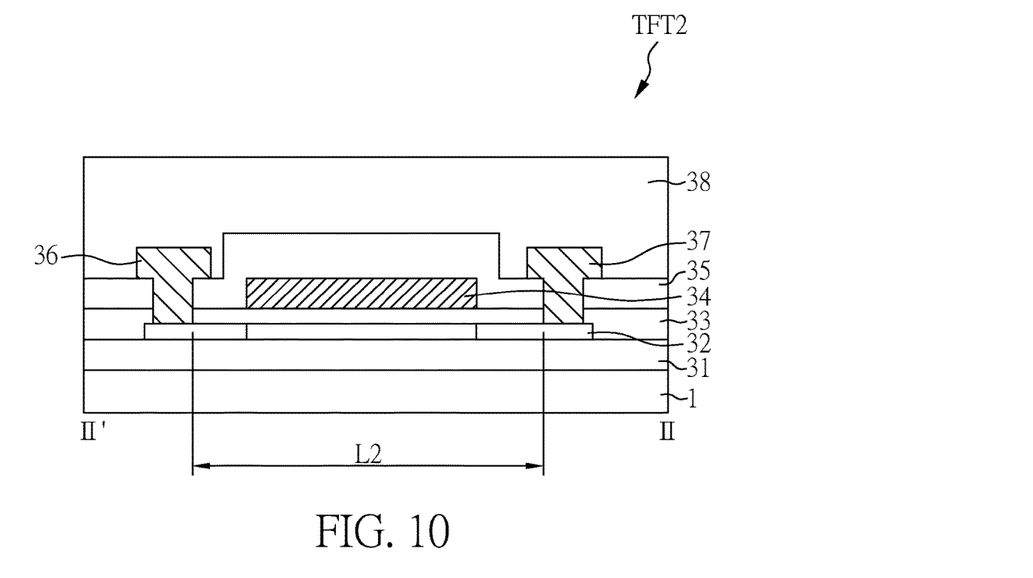
FIG. 10 is a schematic cross sectional view of the second transistor according to Embodiment 3 of the present disclosure.

FIG. 10 is a schematic cross sectional view of the second transistor of the present embodiment.

The display device of the present embodiment is similar to that of Embodiment 1, except that the thickness of the interlayer dielectric layer 35 outside the second gate electrode 34 is reduced.

Other Embodiments

A display device made as described in any of the embodiments of the present disclosure as described previously may be integrated with a touch panel to farm a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a first substrate having a display region and a peripheral region being adjacent to the display region;
   a first transistor disposed on the display region and comprising a first channel layer, wherein the first channel layer comprises an oxide semiconductor layer; and
   a second transistor disposed on the peripheral region and comprising a second channel layer, wherein the second channel layer comprises a silicon semiconductor layer;
   wherein a first ratio is a ratio of a first channel width of the first channel layer to the first channel length of the first channel layer, and a second ratio is a ratio of a second channel width of the second channel layer to a second channel length of the second channel layer;
   wherein the first ratio is greater than or equal to 0.4 and less than or equal to 4.5, and the second ratio is greater than or equal to 0.05 and less than or equal to 0.8.

2. The display device of claim 1, wherein the first ratio is greater than or equal to 0.75 and less than or equal to 2.5.

3. The display device of claim 2, the first ratio is greater than or equal to 1 and less than or equal to 1.5.

4. The display device of claim 1, wherein the second ratio is greater than or equal to 0.09 and less than or equal to 0.45.

5. The display device of claim 4, wherein the second ratio than or equal to 0.3 and less than or equal to 0.45.

6. The display device of claim 1, wherein the first ratio is greater than or equal to 0.75 and less than or equal to 2.5 and the second ratio is greater than or equal to 0.09 and less than or equal to 0.45.

7. The display device of claim 6, wherein the first ratio is greater than or equal to 1 and less than or equal to 2.5 and the second ratio is greater than or equal to 0.09 and less than or equal to 0.45.

8. The display device of claim 6, wherein the first ratio is greater than or equal to 0.75 and less than or equal to 1.5 and the second ratio is greater than or equal to 0.3 and less than or equal to 0.45.

9. The display device of claim 1, wherein the first transistor further comprises a first gate electrode comprising a first overlapping area, the first overlapping area and the first channel layer overlap, the second transistor further comprises a second gate electrode comprising a second overlapping area, the second overlapping area and the second channel layer overlap, and the first overlapping area is larger than the second overlapping area.

10. The display device of claim 1, wherein the oxide semiconductor layer is an IGZO layer.

11. The display device of claim I, wherein the silicon semiconductor layer is a low temperature polysilicon layer.

12. The display device of claim 1, wherein the first transistor electrically connects to the second transistor.

13. The display device of claim 1, wherein the first transistor further comprises a first gate electrode disposed below the first channel layer.

14. The display device of claim 1, wherein the second transistor further comprises a second gate electrode disposed above the second channel layer.

15. The display device of claim 1, wherein the first transistor further comprises a first source electrode and a first drain electrode, and the first channel length is a minimum distance between the first source electrode and the first drain electrode.

16. The display device of claim 1, further comprising a scan line electrically connecting to the first transistor, wherein the scan line extends along a first direction, the first transistor further comprises a first source electrode and a first drain electrode, the first source electrode has a first source width along a second direction substantially vertical to the first direction, the first drain electrode has a first drain width along the second direction, and the first channel width is an average width of the first source width and the first drain width.

17. The display device of claim 1, wherein the second transistor further comprises a second source electrode and a second drain electrode, the second source electrode and the second drain electrode electrically connect to the second channel layer through contact vias, and the second channel width is a maximum with of the contact vias.

18. The display device of claim 1, wherein the second transistor further comprises a second source electrode and a second drain electrode, the second source electrode and the second drain electrode electrically connect to the second channel layer through contact vias, and the second channel length is a minimum distance between the contact vias.

* * * * *